United States Patent [19]

Sawai

[11] Patent Number: 5,296,782
[45] Date of Patent: Mar. 22, 1994

[54] FRONT MASK OF DISPLAY DEVICE AND MANUFACTURING METHOD THEREOF

[75] Inventor: Yasuhiko Sawai, Nagasaki, Japan

[73] Assignee: Mitsubishi Denki Kabushiki Kaisha, Tokyo, Japan

[21] Appl. No.: 100,194

[22] Filed: Aug. 2, 1993

Related U.S. Application Data

[63] Continuation of Ser. No. 778,353, Oct. 17, 1991, abandoned.

[30] Foreign Application Priority Data

Oct. 17, 1991 [JP] Japan .................................. 2-280861

[51] Int. Cl.$^5$ ............................................. G09F 13/00
[52] U.S. Cl. ..................................... 313/499; 313/512; 174/52.2; 264/272.15
[58] Field of Search ................. 313/499, 512; 361/395; 174/52.2, 250, 260; 439/76, 736; 264/272.15, 272.17; 29/848, 849; 372/43, 44; 257/100, 678, 692, 700, 734, 84

[56] References Cited

U.S. PATENT DOCUMENTS

| | | | |
|---|---|---|---|
| 3,325,586 | 6/1967 | Suddick | 264/272.17 X |
| 3,886,581 | 5/1973 | Katsumura et al. | 257/100 X |
| 4,814,943 | 3/1989 | Okuaki | 174/52.2 X |
| 4,843,036 | 6/1989 | Schmidt et al. | 257/100 X |
| 4,935,581 | 6/1990 | Komathu | 174/52.20 X |
| 4,989,935 | 2/1991 | Stein | 257/84 X |

FOREIGN PATENT DOCUMENTS

| | | |
|---|---|---|
| 110275 | 9/1981 | Japan . |
| 49192 | 3/1987 | Japan . |
| 216562 | 8/1989 | Japan . |
| 2098714 | 11/1982 | United Kingdom . |

Primary Examiner—Donald J. Yusko
Assistant Examiner—Ashok Patel
Attorney, Agent, or Firm—Burns, Doane, Swecker & Mathis

[57] ABSTRACT

A front mask of a display device having luminous parts (LED) and peripheral parts (a connector and the like) are integrated by resin-molding with the parts being electrically connected in advance by a film insulated wire. Each part is arranged at a predetermined position prior to resin-molding. Then, electrical connection is make between these parts by the film insulated wire. Finally, resin is injected to manufacture an integrated body.

7 Claims, 7 Drawing Sheets

FRONT MASK OF DISPLAY DEVICE AND MANUFACTURING METHOD THEREOF

This application is a continuation of application Ser. No. 07/778,353, filed Oct. 17, 1991 now abandoned.

BACKGROUND OF THE INVENTION

1. Field of the Invention

The present invention relates to a front mask of a display device in which display parts of an image display device such as LED displaying an image, and the peripheral parts are integrated by resin-molding, as well as to a manufacturing method thereof.

2. Description of Related Art

Figure 1:
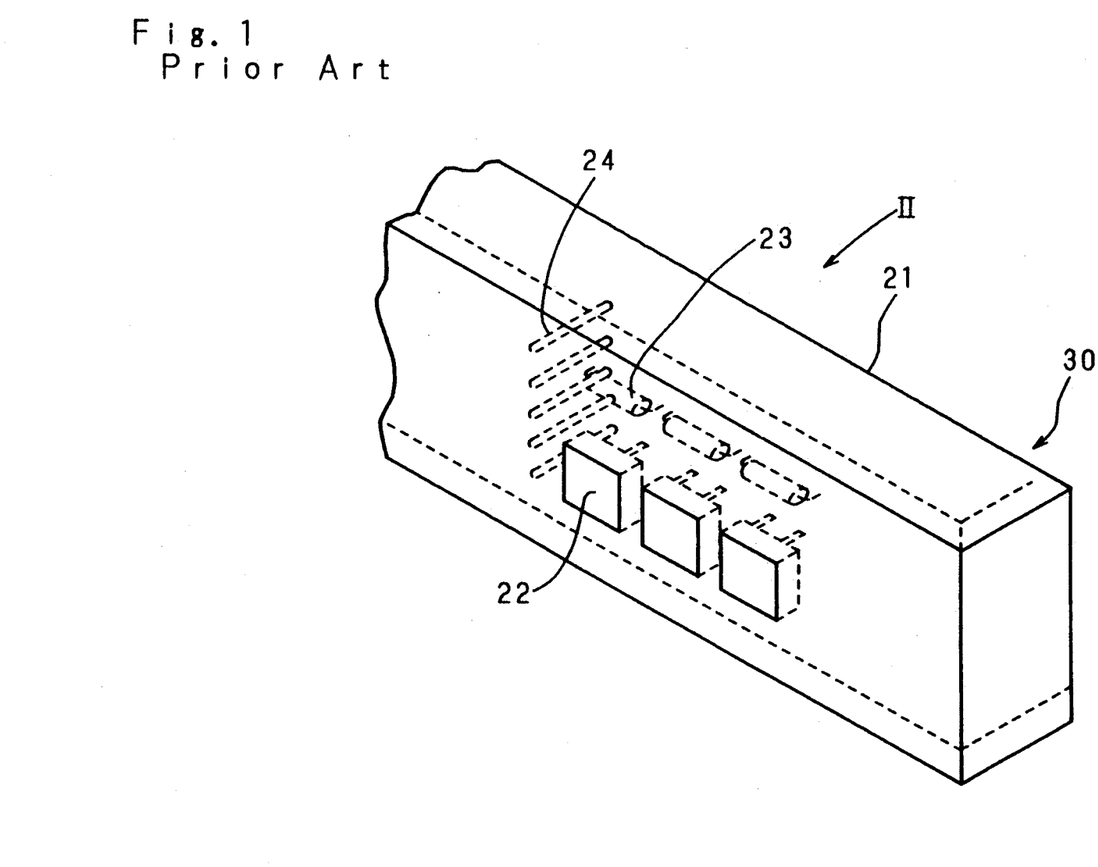
FIG. 1 shows a perspective view of the conventional front mask of display device.
Figure 2:
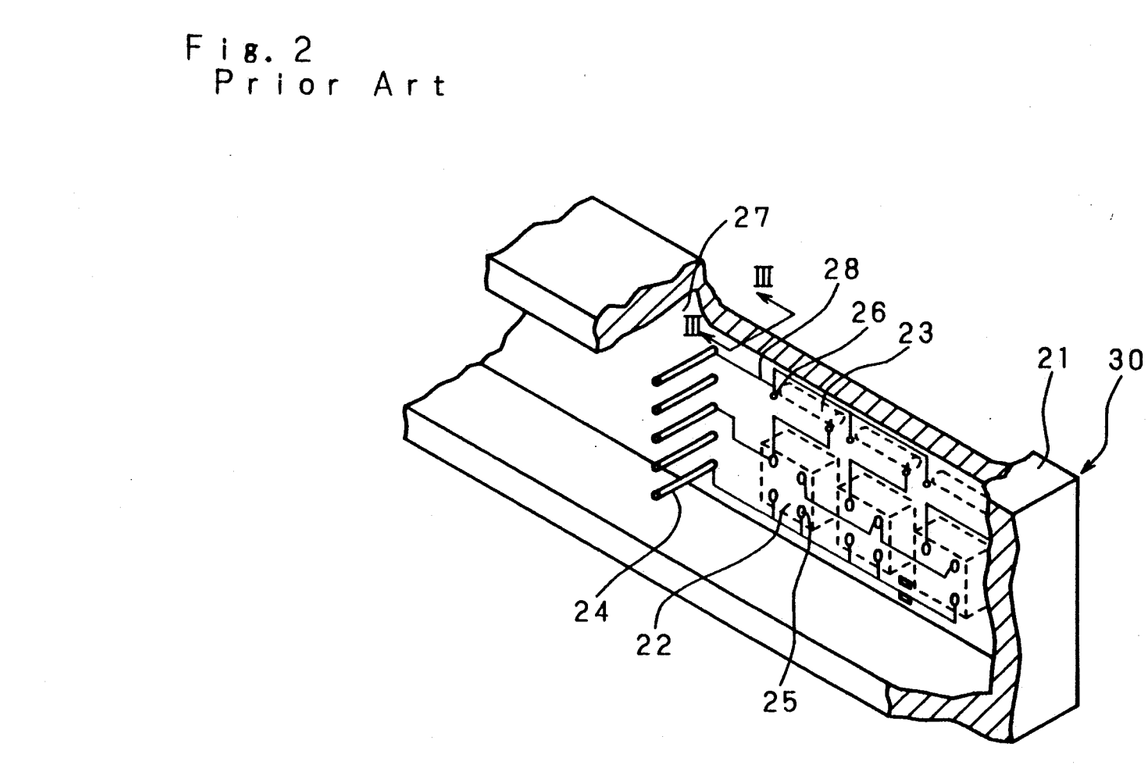
FIG. 2 shows a partially cutaway view of the front mask as seen along the direction II of FIG. 1.
Figure 3:
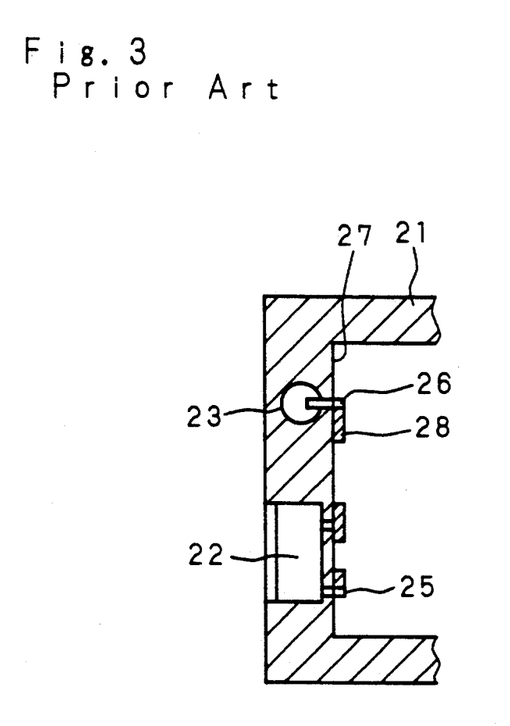
FIG. 3 shows a sectional view of the front mask as seen along the line III—III of FIG. 2.

Japanese Utility Model Application Laid-Open No. 62-49192(1987) discloses a front mask of a display device in which display parts and peripheral parts are integrated by resin-molding. FIG. 1 shows a perspective view of the conventional front mask which has been disclosed as mentioned above. FIG. 2 shows a partially cutaway view of FIG. 1 as seen along the direction II. FIG. 3 shows a sectional view as seen along the line III—III of FIG. 2. A front mask 30 has an LED 22, which functions as luminous parts, and peripheral parts of the luminous parts, including a resistor 23 and a connector 24 to be connected to an external device, are integrated by resin-molding. A terminal 25 of the LED 22 and a terminal 26 of the resistor 23 project beyond the surface 27 of a mask main body 21. An electrical connection is made between the terminal 25 and the terminal 26, between the terminal 25 and the connector 24, and between the terminal 26 and the connector 24, by a conductor pattern 28 which is formed on the surface 27 by printing.

The manufacturing process of the front mask 30 which has such structural features as mentioned above is described below. First, a mold for forming is prepared. The LED 22, the resistor 23, and the connector 24 are installed at the mounting portion, which has been formed at a predetermined position of the mold. Then, liquid resin is injected through an injection opening of the mold. After the resin is hardened, the mold is demolished, and the mask main body 21 which is integrated with each part is taken out. Then, the conductor pattern 28 is formed by printing at the predetermined position on the surface of the mask main body 21 between the terminal 25 and the terminal 26, between the terminal 25 and the connector 24, and between the terminal 26 and the connector 24.

Since a conventional front mask 30 of a display device is constructed as mentioned above, the LED 22, the resistor 23, and the connector 24 are integrated with the mask main body 21. This makes it possible to manufacture such a device with a high level of accuracy in size. There, however, exist problems. For example since the connection between these parts is made by the printed conductor pattern 28, the printing process is complicated. Further since each part should be arranged by considering the level of printing performance of the conductor pattern 28, there is a considerable limitation in the degree of freedom in the arrangement of each part and design.

SUMMARY OF THE INVENTION

In the front mask of display device of the present invention, the luminous parts (LED) and the peripheral parts (the connector and the like) are integrated by resin-molding while they are set in an electrically connected condition by a film insulated wire in advance. Each part is placed at a predetermined position in the mold prior to the resin-molding process. Then, electrical connection is made between the corresponding parts by using the film insulated wire. After the process, resin is injected to manufacture an integrated body.

One object of the present invention is to provide a front mask of a display device which makes it possible to improve operation of the manufacturing process as well as the manufacturing method thereof.

Another object of the present invention is to provide a front mask of a display device which improves the degree of freedom in the arrangement of each part as well as the manufacturing method thereof.

The above and further objects and features of the invention will more fully be apparent from the following detailed description with the accompanying drawings.

DESCRIPTION OF THE PREFERRED EMBODIMENTS

The present invention will be described below in detail with reference to the drawings.

Figure 4:
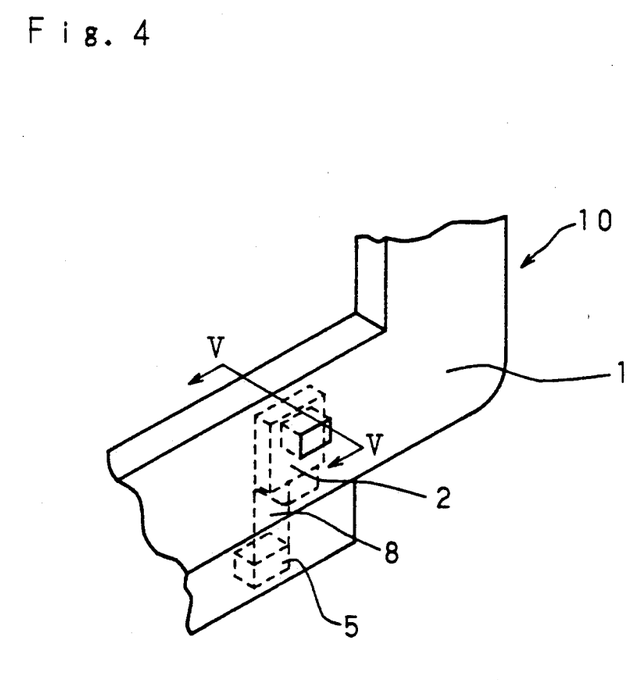
FIG. 4 shows a perspective view of the front mask of display device of the present invention.
Figure 5:
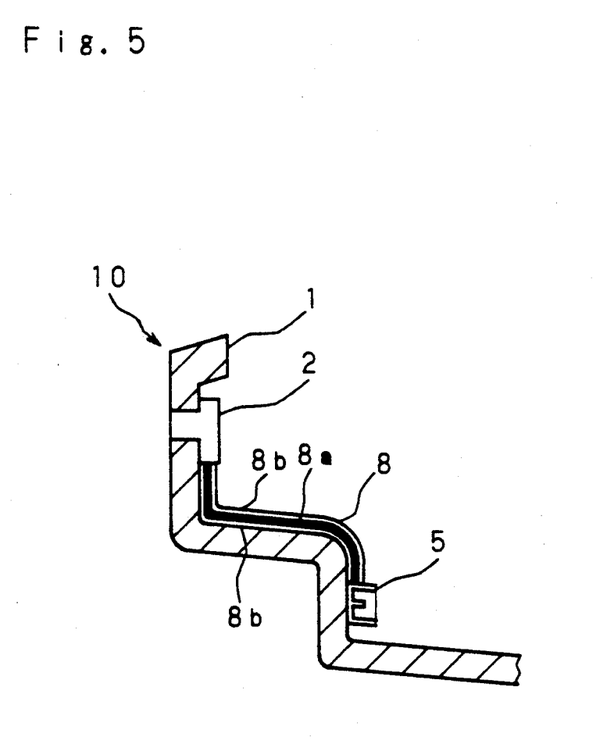
FIG. 5 shows a sectional view of the front mask as seen along the line V—V of FIG. 4, and FIG. 6(a) and FIG. 6(b) are schematic views showing the procedure of resin-molding in the manufacturing process of the front mask of display device of the present invention.

FIGS. 4 and 5 show a preferred embodiment according to the present invention. Reference numeral 10 in the drawing shows a front mask in which the LED 2 and a connector 5 are integrated with a mask main body 1 by resin-molding with epoxy resin and the like. The LED 2 and the connector 5 are electrically connected by a film insulated wire 8 which is integrated with the mask main body 1.

The film insulated wire 8 is formed in an integrated body which is made of a plurality of conductors or insulated wires running in parallel to each other. As a conductor, a thin annealed copper wire, a twined annealed copper wire, a copper foil or the like can be used. The processing of film may be carried out by the method in which adhesion is obtained by such adhesives as PVC (Polyvinyl Chloride) between the insulated wires which are laid out in parallel to each other, or the method in which a conductor is sandwiched between insulating tapes and then heat-pressed. The insulating tape which has a lamination of low melting point polyethylene and the like over one side of the polyester tape is used as material in this process. The film insulated wire 8 which is used in this preferred embodiment has a conductor 8a sandwiched between two sheets of insulating tapes 8b and 8b.

Figure 6A:
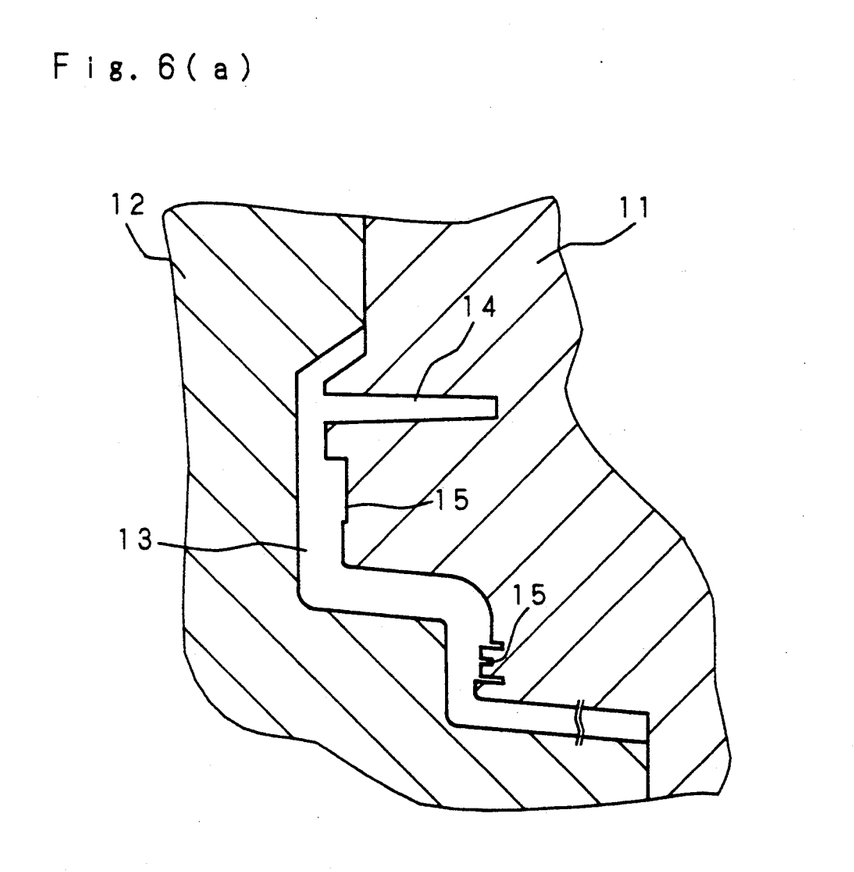

The manufacturing process of the front mask which has the above mentioned features, especially the resin-molding process, is described below by reference to FIG. 6. FIG. 6(a) shows a mold for forming to be used in the resin-molding process. This mold is comprised of the metal mold 11 on the core side and the metal mold 12 on the cavity side. A cavity 13 is established in the position between the molds 11 and 12 in a way that the cavity 13 fits the shape of the front mask to be manufactured. A resin injection opening 14 is established which communicates with the cavity 13. In addition, mounting portions 15 for positioning are provided on the mold 11 on the core side to install the connector, the LED, and the like.

Figure 6B:
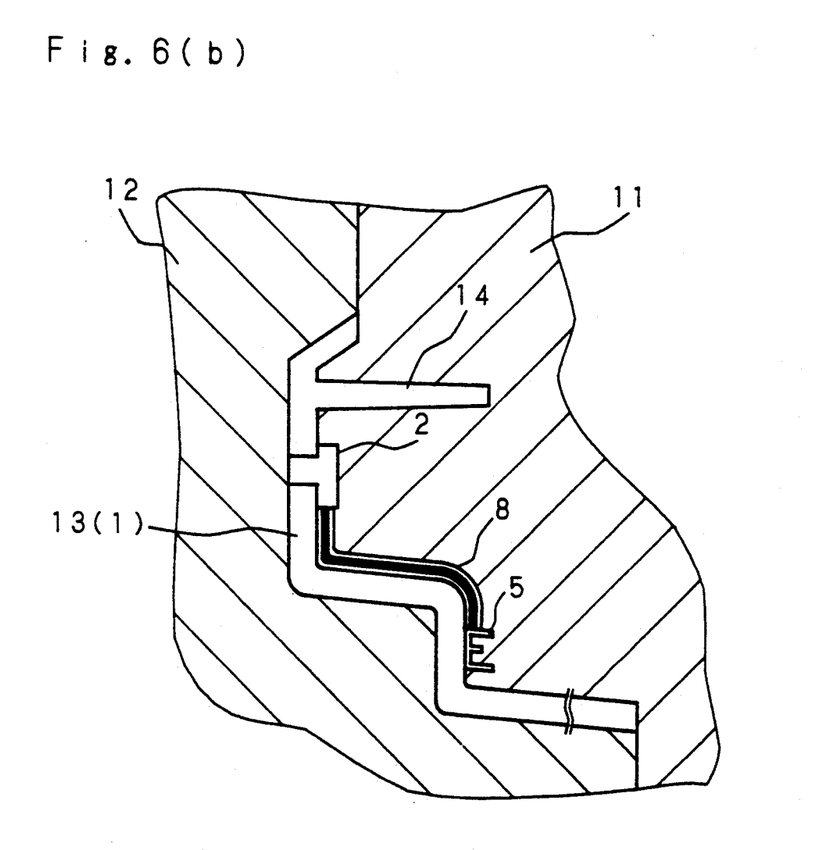

Parts including the LED 2 and the connector 5 are installed on the mounting portions 15 provided at a predetermined position in the mold for forming particular structural features. Then, electrical connection is made between parts including the LED 2 and the connector 5 by using the film insulated wire 8. FIG. 6(b) shows the condition of these parts after the electrical connection. Then, liquid resin is injected through the resin injection opening 14. When the resin hardens, the molds 11 and 12 are demolished and the front mask 10, as shown in FIGS. 4 and 5, is manufactured.

In the above mentioned manufacturing process, electrical connection is made between the corresponding parts by the film insulated wire 8 after each part is set on the mounting portion 15. It is, however, possible to mount these parts as an integrated body at the predetermined position of the mold after forming the electrical connection between the corresponding parts by the film insulated wire 8, and before carrying out resin-molding.

In the front mask 10 which is taken out of the mold, the LED 2 and the connector 5 are integrally resin-molded with the mask main body 1. At this point in time, the film insulated wire 8 is also integrally resin-molded with the mask main body 1. As a result, the method according to the present invention does not involve the complicated work of printing on the narrow surface of the resin after molding like the conventional manufacturing method. This significantly improves operation in the manufacturing process of the front mask.

In addition, a higher degree of freedom is obtained with regard to the arrangement of each part of the front mask as compared with the conventional method since the connecting operation using the film insulated wire 8 can be made without restriction if there is a space provided between these parts. As a result, restrictions in operation of the design work of a display device with a front mask can be considerably reduced when compared to the conventional method.

Furthermore, since the film insulated wire 8 is employed in the process, it is possible to produce approximately the same level of thickness as that of the printing wire of the conventional method. This makes it possible to produce a unit not only compact in size, but also excellent in appearance.

As this invention may be embodied in several forms without departing from the spirit of essential characteristic thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A front mask of a display device, comprising:
   a mask main body made of resin;
   luminous parts integrally resin-molded with said mask main body;
   peripheral parts associated with said luminous parts and integrally resin-molded with said mask main body; and
   film insulated wire comprising a plurality of insulated conductive elements integrally resin-molded with said mask main body for electrically connecting said luminous parts and said peripheral parts.

2. The front mask of the display device as set forth in claim 1, wherein said luminous parts include a laser emitting diode.

3. The front mask of the display device as set forth in claim 1, wherein said peripheral parts include a connector to be connected to an external device.

4. The front mask of the display device as set forth in claim 1, wherein said film insulated wire includes two sheets of insulating tape and a conductor sandwiched between said sheets of tape.

5. The front mask of the display device as set forth in claim 4, wherein said sheets of tape have a lamination of polyethylene and polyester.

6. The front mask of the display device as set forth in claim 4, wherein said conductor is selected from a group consisting of a thin annealed copper wire, a twined annealed copper wire and a copper foil.

7. A front mask of a display device, comprising:
   a plurality of luminous elements;
   a plurality of peripheral components to be electrically connected to said luminous elements;
   a film insulated wire made up of a plurality of insulated conductive elements, each of said insulated conductive elements being electrically connected to one of said luminous elements and to one of said peripheral components; and
   a main mask body comprising resin integrally molded around said plurality of luminous elements, said plurality of peripheral components, and said film insulated wire for physically securing said plurality of luminous elements, said plurality of peripheral components, and said film insulated wire to another.

* * * * *

UNITED STATES PATENT AND TRADEMARK OFFICE
CERTIFICATE OF CORRECTION

PATENT NO. : 5,296,782

DATED : March 22, 1994

INVENTOR(S) : Yasuhiko SAWAI

It is certified that error appears in the above-identified patent and that said Letters Patent is hereby corrected as shown below:

On title page, item [30]
Under "Foreign Application Priority Data", the priority date should read --Oct. 18, 1990-- rather than "Oct. 17, 1991".

Signed and Sealed this

Twenty-seventh Day of September, 1994

Attest:

BRUCE LEHMAN

Attesting Officer
Commissioner of Patents and Trademarks